(12) United States Patent
Peng et al.

(10) Patent No.: US 10,279,311 B2
(45) Date of Patent: May 7, 2019

(54) SYSTEM AND METHOD FOR OPERATING CHEMICAL MECHANICAL POLISHING PROCESS

(75) Inventors: Chih-I Peng, Hsinchu (TW); Hsiang-Pi Chang, New Taipei (TW); Cary Chia-Chiung Lo, Taipei (TW); Teng-Chun Tsai, Tainan (TW); Kuo-Yin Lin, Hsinchu County (TW); Chih-Yuan Yang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 897 days.

(21) Appl. No.: 13/591,167

(22) Filed: Aug. 21, 2012

(65) Prior Publication Data

US 2014/0053980 A1   Feb. 27, 2014

(51) Int. Cl.
| | |
|---|---|
| *B24B 37/04* | (2012.01) |
| *B24B 37/30* | (2012.01) |
| *H01L 21/67* | (2006.01) |
| *B01D 53/26* | (2006.01) |
| *F24F 3/16* | (2006.01) |

(52) U.S. Cl.
CPC ............ *B01D 53/265* (2013.01); *B24B 37/04* (2013.01); *B24B 37/30* (2013.01); *F24F 3/161* (2013.01); *H01L 21/67092* (2013.01)

(58) Field of Classification Search
CPC ............ H01L 21/3212; H01L 21/7684; H01L 21/76819; H01L 21/67092; C09G 1/02; C09K 3/1463; C09K 3/1409; B24B 53/017; B24B 37/042; B24B 37/04; B24B 37/013; B24B 57/02; B24B 37/26; B24B 37/30; B24B 37/105; Y10T 29/49048; B01D 53/265
See application file for complete search history.

(56) References Cited

U.S. PATENT DOCUMENTS

| | | | | |
|---|---|---|---|---|
| 3,813,825 A | * | 6/1974 | Weber | B24B 37/04 451/283 |
| 5,112,277 A | * | 5/1992 | Cruz | H01L 21/67757 414/217 |
| 5,326,316 A | * | 7/1994 | Hashimoto | F24F 3/161 454/187 |
| 5,431,599 A | * | 7/1995 | Genco | F24F 3/1607 454/187 |
| 5,442,826 A | * | 8/1995 | Murata | B08B 9/0325 15/104.062 |
| 5,653,623 A | * | 8/1997 | Kimura | B24B 53/017 451/288 |
| 6,045,716 A | * | 4/2000 | Walsh | B24B 41/061 216/88 |

(Continued)

*Primary Examiner* — Parviz Hassanzadeh
*Assistant Examiner* — Margaret D Klunk
(74) *Attorney, Agent, or Firm* — McDermott Will & Emery LLP

(57) ABSTRACT

A chemical mechanical polishing (CMP) chamber is disclosed. The CMP chamber includes a chamber body, a door mounted on the chamber body and a chamber substructure being one selected from a group consisting of a moisture separator separating a moisture generated in the CMP chamber, a supplementary exhaust port, a transparent window mounted on the door, a sampling port mounted on the door, a sealing material including a metal frame, an o-ring for sealing the door and a combination thereof.

20 Claims, 8 Drawing Sheets

(56) References Cited

U.S. PATENT DOCUMENTS

| | | | |
|---|---|---|---|
| 2004/0242121 A1* | 12/2004 | Hirokawa | B24B 37/013 451/5 |
| 2005/0017168 A1* | 1/2005 | Kim | C23C 16/52 250/288 |
| 2008/0032609 A1* | 2/2008 | Benedict | B24B 53/017 451/56 |
| 2008/0078289 A1* | 4/2008 | Sergi | B01D 46/0013 95/25 |
| 2009/0264049 A1* | 10/2009 | Chen | B08B 15/04 451/28 |

* cited by examiner

SYSTEM AND METHOD FOR OPERATING CHEMICAL MECHANICAL POLISHING PROCESS

FIELD

The present disclosure relates to a system and a method for operating a chemical mechanical polishing (CMP) process. In particular, the system includes a modified CMP chamber.

BACKGROUND

Following the highly growth of the semiconductor industry, the industrial safety issue draws more attention. In the semiconductor manufacturing process, it is needed to use a large amount of combustible, corrosive or toxic chemical materials. The remaining material that is not completely reacted in the process or the hazardous vapor evaporated in the reacting region is mostly transported to the facility exhaust system. The operator may be exposed to an environment contaminated by the toxic gases if the facility exhaust system is not adequately designed.

Among the semiconductor manufacturing processes, the CMP process is used for polishing a semiconductor wafer during the fabrication of semiconductor devices on the wafer. A wafer is "planarized" or smoothed one or more times during a fabrication process in order for the top surface of the wafer to be as flat as possible. CMP manufacturing applications range from microprocessors to Dynamic Random Access Memories ("DRAM"), flat panel display and multi-chip modules. As more manufacturing processes benefit from planarization, the safety and environment concerns for the CMP processes are raised.

For example, Ge and III-V materials are suitable candidates to replace Si as the channel material because of their intrinsic high carrier mobilities. However, these materials will release toxic gases (i.e. $PH_3$ and $AsH_3$) and hazardous byproducts (i.e. $As_2O_3$ and $In_2O_3$) during the CMP process and cause new problems to isolate and remove the toxic gasses and hazardous byproducts.

A complete CMP system consists of: a polisher, consumables, chemical distribution, cleaning systems, measurement, process isolation, an environmental control and a material handling system. A CMP system performs the CMP process in a polisher. The conventional polisher includes a door for isolating the chemical materials used in the CMP process from the outside environment, and a platen plenum that enables the operators to disassemble and maintain the polisher is configured below the polisher. Typically, the door of the polisher is made of the plastics and sealed by the sponge, which will cause the seal loss and cover damage after repeated use. Another disadvantage of the conventional polisher is that the door is opaque, which does not allow the operators to observe the process condition during operating and before open the door. Since the present CMP system does not provide a controllable processing environment or fails to avoid health and safety issues resulted from hazard and toxic CMP byproducts, so that providing a modified CMP system that properly manages controls and enhances the process environment is crucial.

The traditional CMP system does not have a good seal function and a monitoring function that ensure the process condition, and thus the toxic gasses often leak out of the polish chamber during the CMP process or outflow when the wafer is taken out by the operators. It is desired to ensure the environmental safety during the CMP process and before opening the door of the polisher in case that the operator may suffer from the toxic materials. Therefore, an improved CMP system is needed. For efficiently removing the byproducts, a modified CMP system is provided in this disclosure.

The current CMP system is a semi-open system kept at a minor negative pressure by the platen plenum exhaust connecting to the facility exhaust for removing the airborne byproducts. The platen plenum exhaust cannot efficiently pump out the byproducts. Moreover, the exhausted air contains huge moisture generated from the CMP process. The original design of the CMP system may incur water leakage resulted from moisture condensation and trap byproducts in the exhaust pipes resulting in a clogging issue. In order to enhance the moisture separating function of the CMP exhaust for removing moisture from the exhausted hazard byproducts (i.e. III-V compounds, $RuO_4$ . . . ) and alleviating the leakage from the slits or cracks of the exhaust pipe, a CMP system with a moisture separator is also provided in this disclosure.

In view of the drawbacks of prior arts, there is a need to solve the above deficiencies/problems.

SUMMARY

In accordance with one aspect of the disclosure, a moisture separator for removing a moisture generated in a CMP chamber is provided, which includes a separator body having a wall, a cooling element disposed on the wall to condense the moisture into a liquid, and a drain system draining therethrough the liquid.

In accordance with another aspect of the disclosure, a CMP system is provided, which includes a working region generating a moisture and a moisture separator separating the moisture out of the working region.

In accordance with one more aspect of the disclosure, a method for operating a CMP system is provided, which includes forming an air flow to carry therewith a moisture generated within the CMP system, controlling a temperature of the air flow to condense the moisture into a liquid, and removing the liquid out of the CMP system.

In accordance with a further aspect of the disclosure, a CMP chamber is provided, which includes a chamber body, a door mounted on the chamber body, and a chamber substructure being one selected from a group consisting of a moisture separator separating a moisture generated in the CMP chamber, a supplementary exhaust port, a transparent window mounted on the door, a sampling port mounted on the door, a sealing material including a metal frame, an o-ring for sealing the door and a combination thereof.

DETAILED DESCRIPTION

The products and methods of the present disclosures will be fully understood from the following embodiments and thereby being accomplished based thereon by one skilled in the art. However, the practice of the present application is not intended to limit to the following embodiments in its practice, and the skilled person can still conduct other embodiments according to the spirit of embodiments presented herein that belong to the scope of this disclosures.

The present disclosures disclose a CMP system for providing a safe operation environment. The present disclosures can be used in any kind of CMP process, but is particularly suitable for use in III-V CMP and Ru CMP, wherein the exhausted gas contains toxic byproducts.

Figure 1:
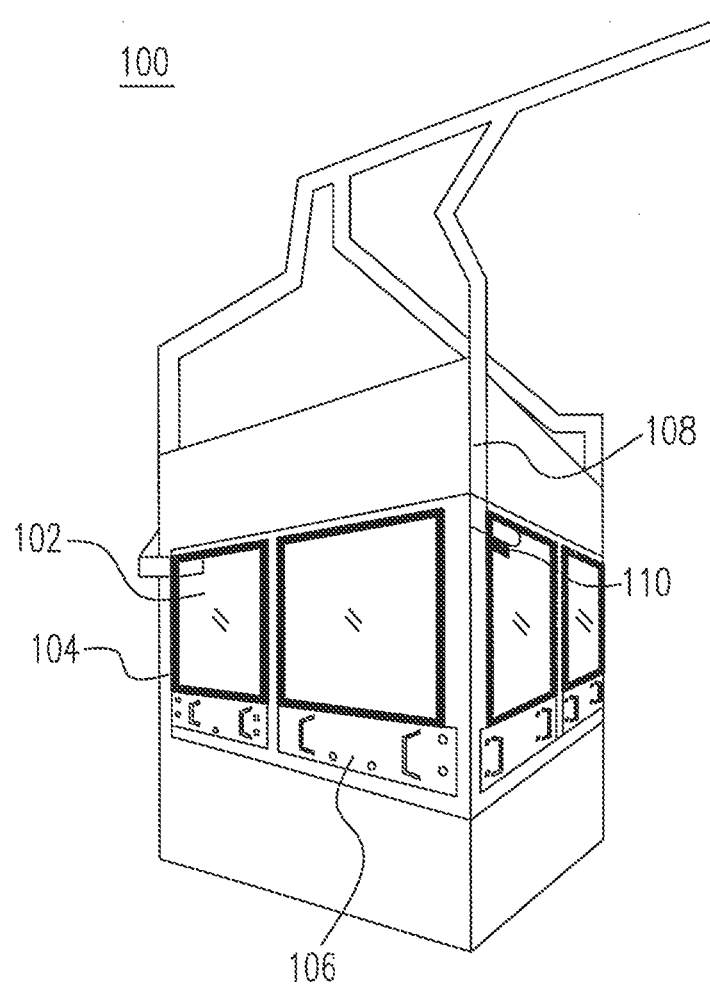
FIG. 1 is a schematic diagram illustrating a CMP system according to the present disclosure.

FIG. 1 shows a CMP system 100 according to the present disclosure. For illustrating, the CMP system 100 is depicted as including three polishers. Each polisher includes a door, a plenum 106 and an exhaust port 110, wherein the door includes transparent windows 102 and a metal frame 104, and an exhaust 108 (as shown in FIG. 1) connects to the polisher via the exhaust port 110. As hereafter further described, the CMP system 100 further includes a moisture separator. Referring to FIG. 1, the transparent windows 102 covers two sides of the polishers. The transparent window 102 can be a part of the door or serve as a transparent door depending on the design of the polisher. Alternatively, the transparent window 102 can be configured at another side different from the door and merely provides the observation function. As shown in FIG. 1, the exhaust port 110 is disposed on the wall of the polisher and provides a connection for the polisher and the exhaust 108. The exhaust 108 extends to the facility exhaust system for removing the gases and the airborne byproduct generated in the CMP process. In this embodiment, the CMP system 100 has one exhaust 108 for each polisher. It is understood that the polisher may include any number of the exhaust 108.

The exhaust port 110 provides a supplementary exhaust port for the polisher in addition to the platen plenum exhaust. By connecting the exhaust 108 to the polisher, the exhaust 108 removes the gases and byproducts generated in the CMP process more efficiently while the platen plenum exhaust only provides a minor negative pressure. The exhaust 108 can be turned on before the polishing process or in a troubleshooting process for preventing from the gas outflow.

Figure 2A:
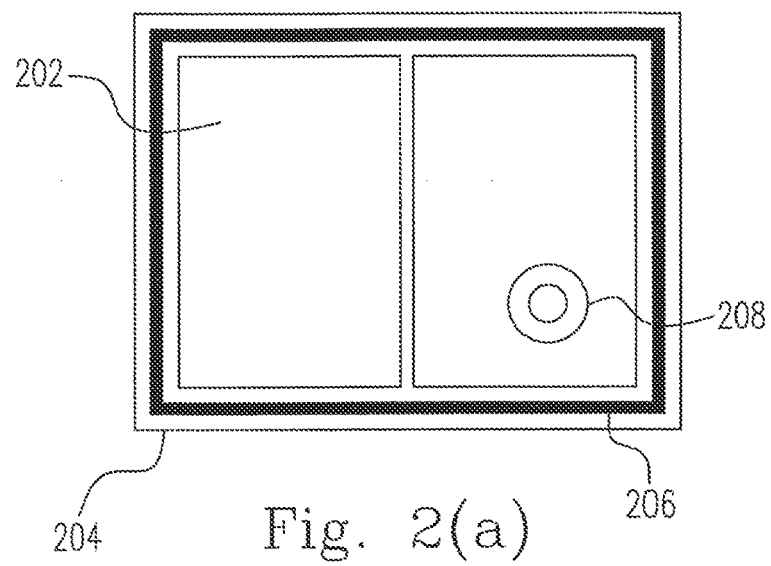
FIG. 2(a) is a schematic diagram illustrating the front view of the door of the CMP system in FIG. 1.
Figure 2B:
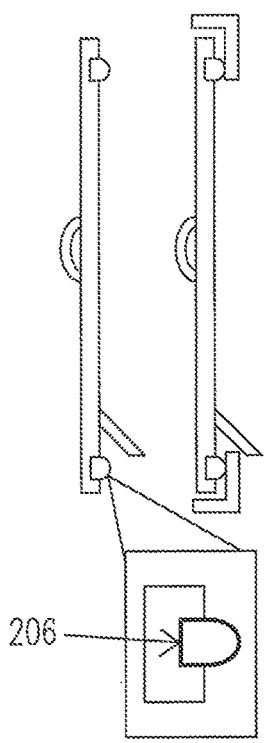
FIG. 2(b) is a schematic diagram illustrating the side view of the door of the CMP system in FIG. 1.

FIGS. 2(a) to 2(b) respectively illustrate detailed schemes for the door of the CMP 100 according to the present disclosure. Referring to FIG. 2(a), the door of the CMP 100 includes a transparent window 202, a metal frame 204, an O-ring seal 206 and a sampling port 208. The transparent window 202 is similar to that in FIG. 1. The metal frame 204 is configured around the transparent window 202 for enhancing the strength of the transparent window 202 and preventing from the cover damage. The suitable materials for the metal frame 204 include iron, aluminum or aluminum alley. As the side view of the FIG. 2(b) shown, the O-ring seal 206 is a hollow O-ring mounted in the metal frame 204, which provides a better seal function than the traditional sponge seal. When the door of the polisher is closed, the O-ring seal 206 is tightly attached to the wall of the polisher. The sampling port 208 is disposed on the transparent window 202 for checking the gases inside the polisher before opening the door. The design of the sampling port 208 secures the environmental safety and avoids the operators from being directly exposed to the toxic gasses.

Figure 3A:
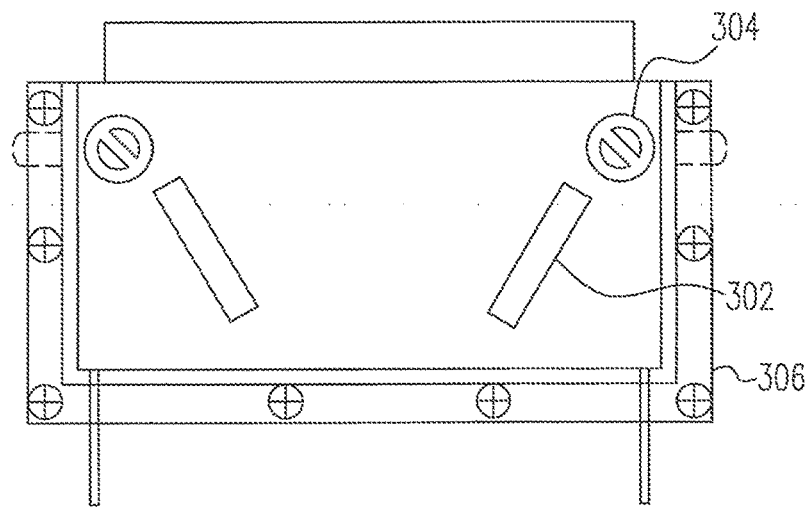
FIG. 3(a) is a schematic diagram illustrating the front view of the platen plenum of the CMP system in FIG. 1.
Figure 3B:
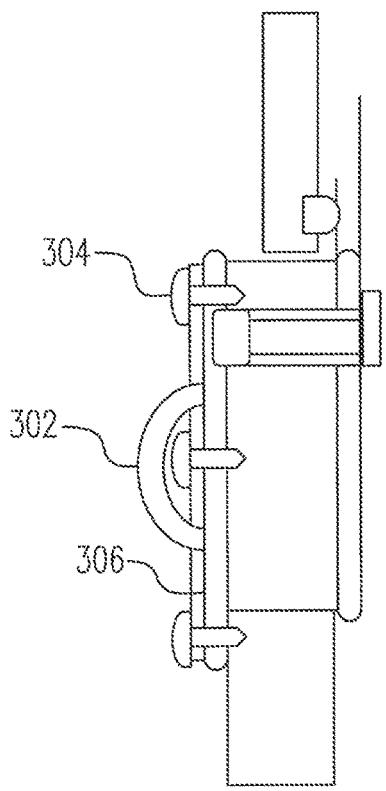
FIG. 3(b) is a schematic diagram illustrating the side view of the platen plenum of the CMP system in FIG. 1.

FIGS. 3(a) and (b) respectively show the front view and the side view of the platen plenum of the CMP system 100 in FIG. 1. The platen plenum includes the handles 302, the latches 304 and a sealing bracket 306. The handles 302 enable the operators to pull out the platen plenum and disassemble or maintain the polisher easily. It is understood that the number of the handles 302 is variable. The latches 304 and the sealing bracket 306 fix the platen plenum to the polisher and provide a sealing function for the platen plenum. The latches 304, the sealing bracket 306 in FIGS. 3(a) and 3(b) together with the O-ring sealing in FIGS. 2(a) and 2(b) form a region isolated from the outside environment. When the toxic gases occur in the polisher, they will not leak from the gap of the platen plenum or the door of the polisher.

For testing the sealing function of the current CMP system, the first tracer gas test using the sulfur hexafluoride ($SF_6$) as the tracer gas is performed. Tracer gas analysis, as described in SEMI S6 (a safety guideline providing the safety performance criteria for exhaust ventilation of semiconductor manufacturing equipment (SME)), is used to test the ability of the exhausted enclosure to contain hazardous gases. The test procedure is developed based on the SEMI S6-707 protocols. A known concentration of $SF_6$ in nitrogen (N2) is injected within the enclosure at a likely failure point and at a release rate equivalent to the rate of a realistic worst case leak of process gas. Air samples are taken outside of the enclosures and analyzed using an electron capture gas chromatograph (GC) with a detector capable of detecting $SF_6$ concentrations as low as 50 ppt. The measured value of SF6 is translated into an "equivalent release concentration" (ERC) of the process chemistry used within the enclosure with the highest health hazard (lowest Hazard Index Number). The ERC is then compared to the threshold limit value (TLV). The acceptable criterion for emissions into the workroom air is less than 25% of the TLV during a realistic worst case release. The acceptable criterion for emissions into the workroom air is less than 1% of the TLV during a normal operation. The challenge chemistry selected for simulation in these tests is 100% Arsine. The test stimulates generation of III-V hydrides (specifically arsine) when slurry chemistry reacts with the III-V film on the wafer during the CMP process. The test parameters are as follows.

Test Parameters:
1. $SF_6$ release rate: 0.1 liters per minute (lpm)
2. Tracer gas release point: slurry dispense point on the platen slurry arm
3. Release direction: down towards platen about a half inch from the platen
4. Tracer gas concentration: 10.21%
5. Process gas: arsine off gassing from the wafer
6. Background: <0.115 ppb Before applying the CMP system of the present disclosure, the current CMP system fails in the first tracer gas test under the SEMI S6 criteria. From the preliminary results, it is found that the polisher window and the platen plenum are the major tracer gas leakage areas.

After applying the CMP system of the present disclosure, the second tracer gas test is performed. The test procedure is developed based on the SEMI S6-707 protocols and the parameters are as follows.

Test Parameters:

1. $SF_6$ release rate: 0.5 liters per minute (lpm) (totally distributed between 3 platens)
2. Tracer gas release point: slurry dispense points on the platen slurry arm
3. Release direction: towards platen (wet surface)
4. Stimulates 100% arsine off-gassing from the wafer
5. Sample taken at 4, 6 and 8 minutes at each side of the polisher
6. Sample taken at 10 minutes after turning gas off for 1 minute The results of the second tracer gas test are shown in Table 1.

TABLE 1

| Test-Sample No. | Gas Release Rate (lpm) | $SF_6$ Conc. (ppb) | ERC (ppb) | % TLV | Pass Criteria (ppb) | Result |
| --- | --- | --- | --- | --- | --- | --- |
| N4  | 0.50 | 0.439   | 0.063   | 1.254%  | 5.0 | Pass |
| N6  | 0.50 | 0.605   | 0.086   | 1.729%  | 5.0 | Pass |
| N8  | 0.50 | <0.050  | <0.007  | <0.143% | 5.0 | Pass |
| S1  | 0.50 | 0.238   | 0.034   | 0.660%  | 5.0 | Pass |
| S3  | 0.50 | <0.050  | <0.007  | <0.143% | 5.0 | Pass |
| S8  | 0.50 | <0.050  | <0.007  | <0.143% | 5.0 | Pass |
| S10 | 0.50 | 0.062   | 0.009   | 0.177%  | 5.0 | Pass |
| W4  | 0.50 | <0.050  | <0.007  | <0.143% | 5.0 | Pass |
| W6  | 0.50 | <0.050  | <0.007  | <0.143% | 5.0 | Pass |
| W8  | 0.50 | 0.138   | 0.020   | 0.394%  | 5.0 | Pass |
| W10 | 0.50 | <0.050  | <0.007  | <0.143% | 5.0 | Pass |
| E4  | 0.50 | 0.127   | 0.018   | 0.363%  | 5.0 | Pass |
| E6  | 0.50 | 0.217   | 0.031   | 0.620%  | 5.0 | Pass |
| E8  | 0.50 | 0.121   | 0.017   | 0.346%  | 5.0 | Pass |
| E10 | 0.50 | <0.050  | <0.007  | <0.143% | 5.0 | Pass |

Note:
"Pass" means % TLV is less than 25%
Data below the detection limit of the gas chromatograph (0.05 ppb) are presented as <0.05 ppb ERC and <0.98% of the TLV.

As discussed above, the tracer gas concentrations measured by the GC can be used to calculate an "equivalent release concentration" (ERC) for the process chemistry used within the enclosure with the highest health hazard (lowest Hazard Index). The ERC is then compared to the TLV. According to SEMI S2 criteria, the enclosure is acceptable if the ERC is less than 25% of the TLV for a realistic worst-case release. A sample calculation (N6) is shown here. The $SF_6$ concentration of sample N6 shown in Table 1 is 0.605 ppb.

$$ERC(ppb) = \frac{\text{Measured concentration of } SF_6(ppb) \times \text{Process gas concentration}(\%)}{\text{Concentration of tracer gas used during testing } (\%)}$$

$$ERC(ppb) = \frac{0.605 \text{ ppb} \times 100\%}{700\%} = 0.086$$

$$TLV \text{ of arsine} = 0.005 \text{ ppm} = 5 \text{ ppb}$$

$$\% TLV = 0.086/5 \times 100 = 1.72\% \text{ of the } TLV$$

In this example, 1.72% is less than 25% such that the enclosure passes the second tracer gas test. From the above data, it can be seen that the CMP system of the present disclosure with the new door and platen plenum improves the sealing function of the system.

Figure 4:
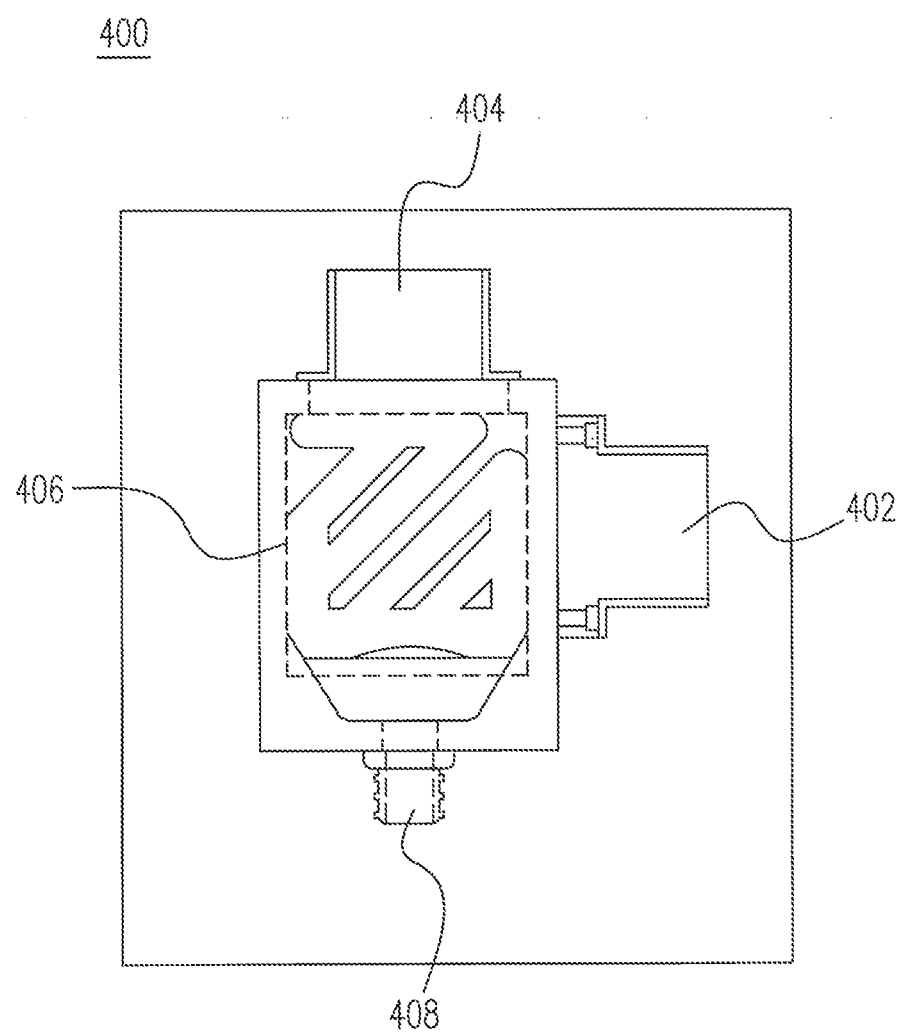
FIG. 4 is a schematic diagram illustrating the perspective view of the moisture separator according to the present disclosure.

Another purpose of the present disclosure is to enhance the moisture separating function of the CMP exhaust for separating the moisture from the airborne byproducts. For overcome the leaking problem in the exhaust of the CMP system, a moisture separator and a CMP system containing the same are also provided in this disclosure. FIG. 4 shows the perspective view of the moisture separator 400 according to the present disclosure. The moisture separator 400 can be configured on any suitable exhaust of the CMP system such as the platen plenum exhaust or the exhaust 108 shown in FIG. 1. As shown in FIG. 4, the moisture separator 400 includes an exhaust inlet 402, an exhaust outlet 404, a cooling element 406 and a drain 408. The exhaust inlet 402 receives the byproducts generated in the working region of the CMP system (i.e the polish chamber) and the exhaust outlet 404 removes the byproducts out of the CMP system. The byproducts are a mixture being one selected from a group consisting of a manufacturing remainder, the toxic gas, the polishing debris, the slurry, the fine particle, the dust, the solid, the moisture, the liquid, and a combination thereof. The exhaust outlet 404 may discharge the hazard airborne byproducts (III-V, $RuP_4$ . . . ). Among these byproducts, the moisture entering the moisture separator 400 can be cooled by the cooling element 406 as a liquid and then flow out through the drain 408.

Figure 5:
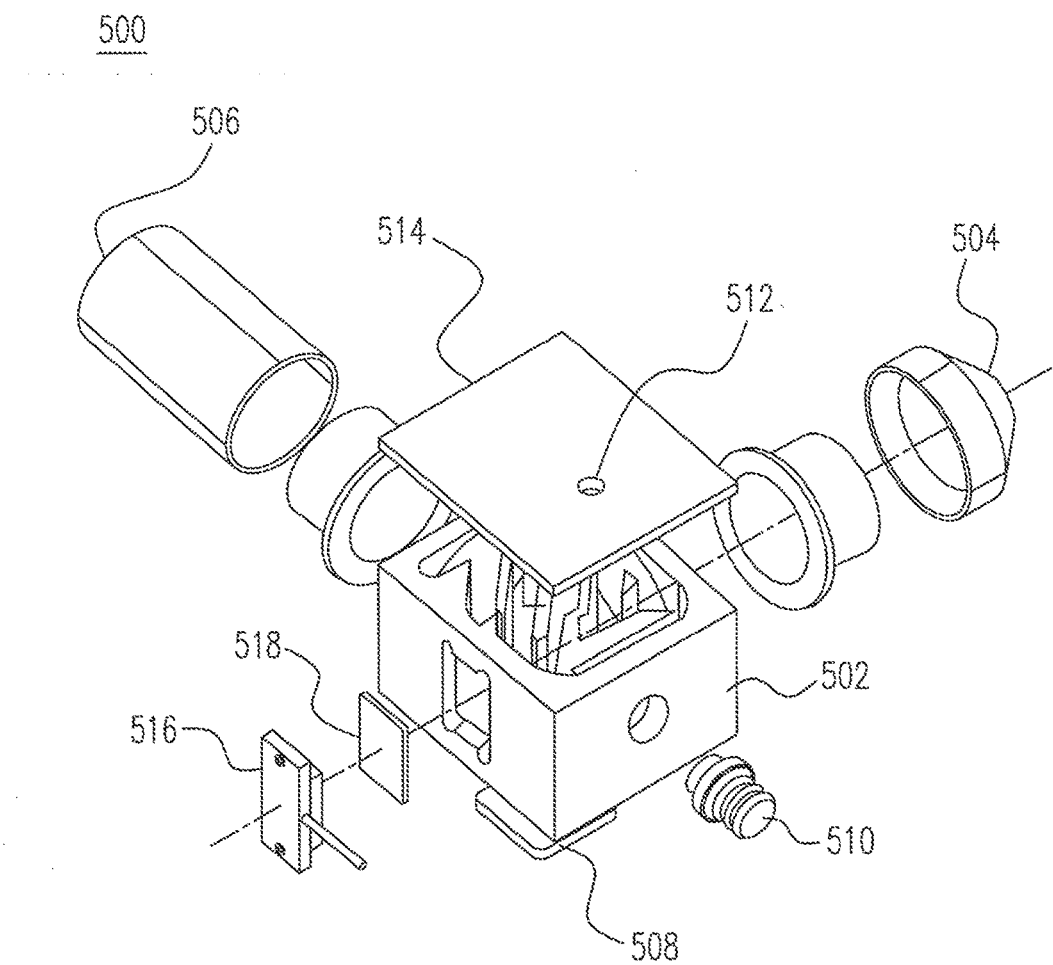
FIG. 5 is a schematic diagram illustrating the exploded view of the moisture separator according to the present disclosure.

FIG. 5 shows the exploded view of the moisture separator 500 according to the present disclosure. For illustrating, the moisture separator 500 in FIG. 5 is depicted as having a separator body 502, and the separator body 502 is a cuboid. The exhaust inlet 504 and the exhaust outlet 506 are disposed on different sides of the separator body 502 to remove the byproducts through the moisture separator 500. The cooling element 508 is disposed on the wall of the separator body 502 to condense the moisture into a liquid. In this example, the cooling element 508 is a cooling chip that controls the temperature of the separator moisture 500, which may be any type or have any structure without being limited by the exemplary drawing. When the moisture has been condensed into the liquid, the liquid can be drained from the drain 510 and/or the overflow element 512. The drain 510 is an outlet disposed on one side of the separator body 502, for example, the bottom of the separator body 502. The overflow element 512 is an opening or a hole on another side of the separator body 502 different from that of the drain 510. As shown in FIG. 5, the overflow element 512 is disposed on a sealing plate 514 covering one side of the separator body 502, and the level of the overflow element 512 can be set higher than the drain 510. The overflow element 512 serves as an additional outlet for the liquid when the drain 510 is not sufficient to drain the liquid within the moisture separator 500 or the drain 510 malfunctions. Additionally, the moisture separator 500 includes a sensor 516 and a link system interlock 518. The sensor 516 is mounted on the wall of the separator body 501 by coupling to the link system interlock 518. The sensor 516 can monitor the level of the liquid in the moisture separator 500 and triggers an alarm when the level of the liquid is higher than a threshold. This alarm may shut-off the exhaust to prevent the malfunction of the drain system (including the drain 510 and the overflow element 512). It is comprehended that all of the above-mentioned components can be included in the moisture separator at any suitable position while remaining consistent with an embodiment.

Figure 6:
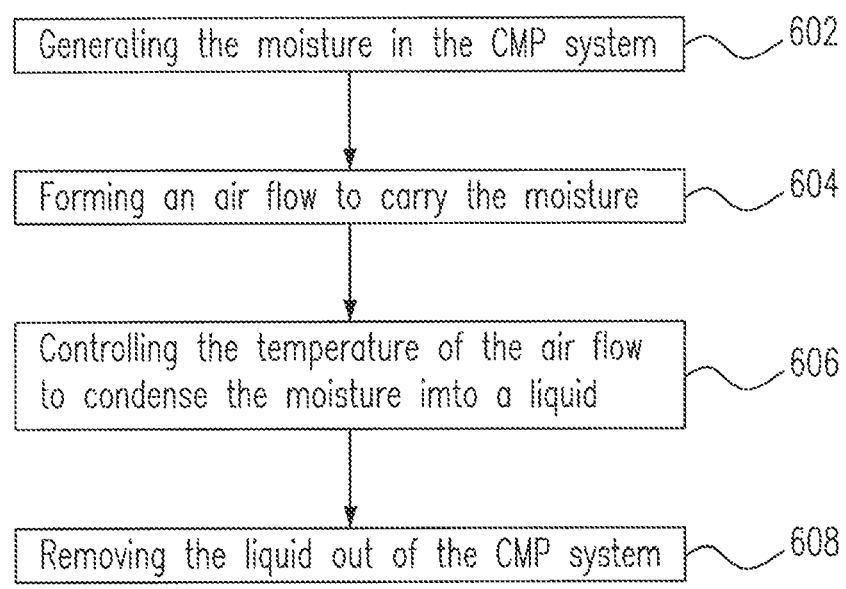
FIG. 6 is a schematic diagram illustrating a flow chart of the method for operating the CMP system according to the present disclosure.

When the moisture separator of the present disclosure is configured in a CMP system, the CMP system has an ability to control the temperature of the moisture generated in the CMP process and to efficiently remove the liquid in the moisture separator, as the method described in FIG. 6. FIG. 6 shows a flow chart of the method for operating the CMP system according to the present disclosure. When the CMP process begins, the moisture is generated in the CMP system (step 602). Then, the moisture is carried by an air flow generated from either the facility exhaust or the exhaust as shown in FIG. 1 (step 604). Since the moisture separator includes a cooling element, it can control the temperature of the air flow to condense the moisture into a liquid (step 606). Upon the moisture is condensed into the liquid, the liquid is removed out of the CMP system (step 608) by the drain, the overflow element or the both, the drain system in the moisture separator. Further, the method includes a step of monitoring the level of the liquid in the moisture separator and triggering an alarm when the level of the liquid is higher than a threshold.

By way of example, and without limiting the disclosure, the above method in FIG. 6 may be performed by the following CMP systems 700 and 800.

Embodiment 1: CMP System 700

Figure 7:
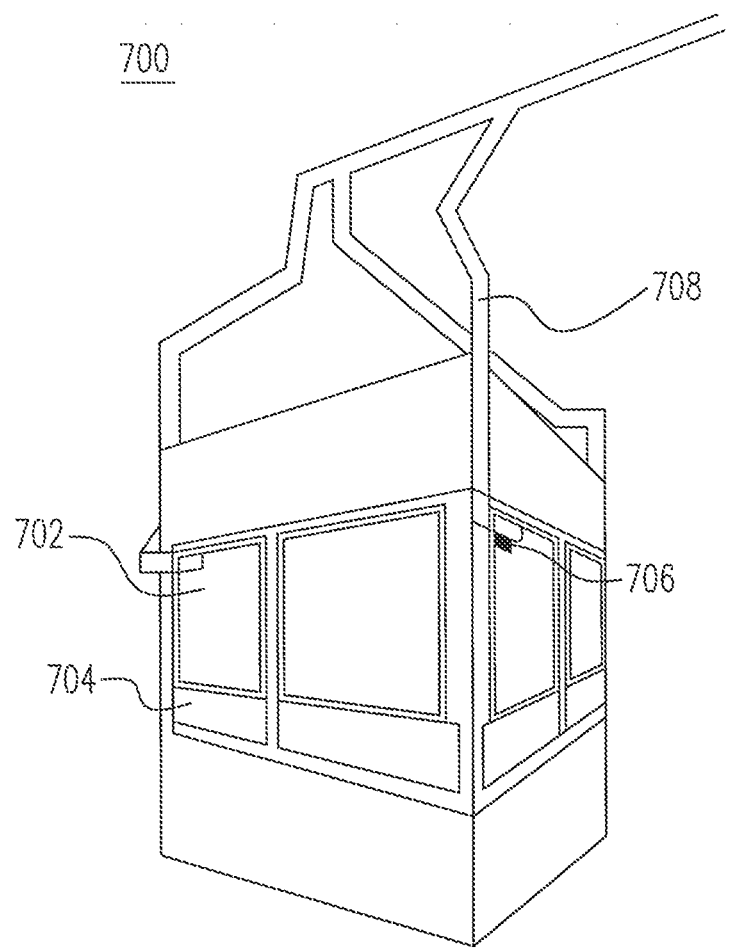
FIG. 7 is a schematic diagram illustrating the first embodiment according to the present disclosure.

For illustrating, the CMP system 700 is depicted as including three polishers. Each polisher includes a door 702, a platen plenum 704 and an exhaust port 706, wherein the door 702 is opaque and made of the plastics and an exhaust 708 connects to the polisher via the exhaust port 706 and extends to the facility exhaust system for removing the moisture generated in the CMP process. Although it is not shown in FIG. 7, the exhaust 708 contains a moisture separator, and the structure of the moisture separator is as described in FIG. 4. By using the moisture separator, the moisture generated in the CMP process can be condensed to the liquid and then flow out of the CMP system 700.

Embodiment 2: CMP System 800

Figure 8:
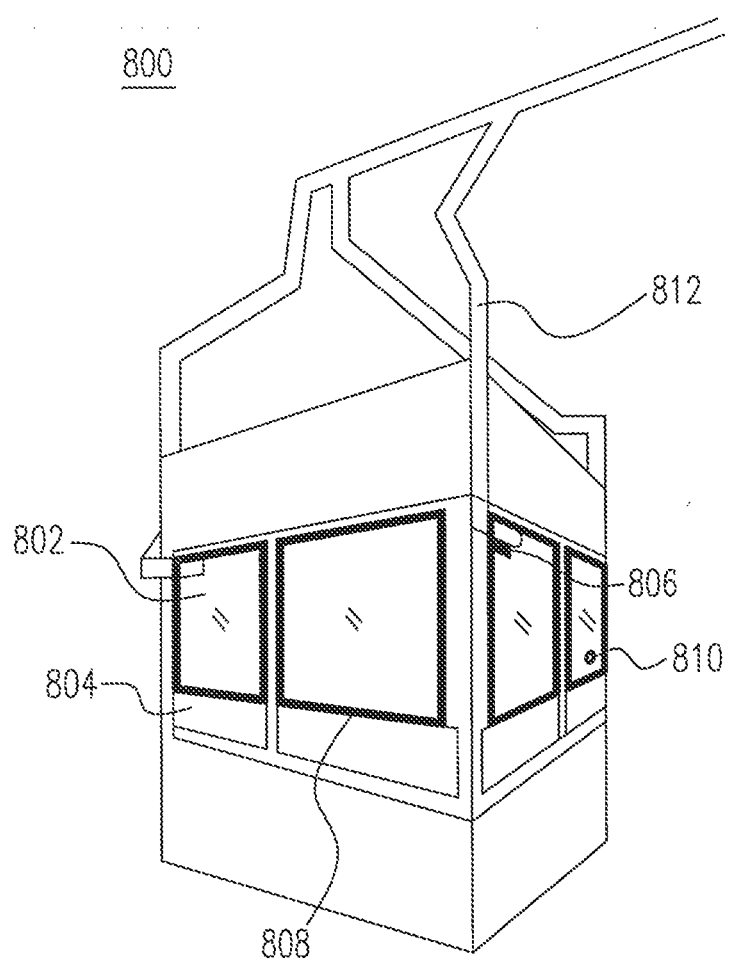
FIG. 8 is a schematic diagram illustrating the second embodiment according to the present disclosure.

For illustrating, the CMP system 800 is depicted as including three polishers. Each polisher includes a door 802, a platen plenum 804 and an exhaust port 806, wherein the door 802 is transparent and has a metal frame 808, an O-ring seal (not shown) and a sampling port 810, and an exhaust 812 connects to the polisher via the exhaust port 806 and extends to the facility exhaust system for removing the gases and the airborne byproduct generated in the CMP process. The metal frame 808 is configured around the door 802 for enhancing the strength thereof and preventing from the cover damage. The O-ring seal is a hollow O-ring configured in the metal frame 808, which provides a better seal function than the traditional sponge seal. When the door 802 is closed, the O-ring seal is tightly attached to the wall of the polisher. The sampling port 810 is disposed on the door 802 for checking the gases inside the polisher before opening the door 802. Although it is not shown in FIG. 8, the exhaust 812 contains a moisture separator, and the structure of the moisture separator is as described in FIG. 4. By using the moisture separator, the moisture generated in the CMP process can be condensed to the liquid and then flow out of the CMP system 800.

From the above embodiments, it is known that the apparatus or the elements disclosed herein can be optionally combined depending on the need of the customer. For example, the CMP system of the present disclosure may only include a moisture separator, or include the moisture separator, the transparent window and the sampling port. While the present disclosure has been described with reference to the preferred embodiments, it will be understood by those skilled in the art that various modifications and variations may be made therein without departing from the scope of the present disclosure as defined by the appended Claims.

Other Embodiments

1. A moisture separator for removing a moisture generated in a chemical mechanical polishing (CMP) chamber includes a separator body having a wall, a cooling element disposed on the wall to condense the moisture into a liquid, and a drain system draining therethrough the liquid.

2. According to the embodiment 1, the moisture separator further including an exhaust receiving the moisture from a working region generating a byproduct.

3. According to one of the preceding embodiments 1-2, wherein the exhaust has an exhaust inlet and an exhaust outlet.

4. According to any one of the preceding embodiments, wherein the byproduct is a mixture being one selected from a group consisting of a manufacturing remainder, a toxic gas, a polishing debris, a slurry, a fine particle, a dust, a solid, the moisture, a liquid, and a combination thereof.

5. According to any one of the preceding embodiments, wherein the cooling element is one of a cooling chip and a cooling coil.

6. According to any one of the preceding embodiments, wherein the drain system further comprises an overflow element providing an additional outlet for the fluid.

7. According to any one of the preceding embodiments, the moisture separator further including a level sensor monitoring the level of the liquid.

8. A chemical mechanical polishing (CMP) system includes a working region generating a moisture and a moisture separator separating the moisture out of the working region.

9. According to the embodiment 8, wherein the working region generates a byproduct.

10. According to one of the embodiments 8-9, wherein the byproduct is a mixture being one selected from a group consisting of a manufacturing remainder, a toxic gas, a polishing debris, a slurry, a fine particle, a dust, a solid, the moisture, a liquid, and a combination thereof.

11. According to any one of the preceding embodiments, wherein the moisture separator is disposed in at least one of a platen plenum exhaust and a supplementary exhaust connected to the working region.

12. According to any one of the preceding embodiments, wherein the working region is a closed chamber including a transparent window with a metal frame and an o-ring seal, and a sampling port on the transparent window.

13. According to any one of the preceding embodiments, the CMP system further including a plenum adjacent to the working region.

14. According to any one of the preceding embodiments, wherein the plenum comprises a sealing bracket, a handle and a latch.

15. A method for operating a chemical mechanical polishing (CMP) system includes forming an air flow to carry therewith a moisture generated within the CMP system, controlling a temperature of the air flow to condense the moisture into a liquid, and removing the liquid out of the CMP system.

16. According to the preceding embodiments, wherein the temperature is controlled by a cooling element.

17. According to one of the preceding embodiments, wherein the air flow is formed by an exhaust.

18. According to any one of the preceding embodiments, wherein the liquid is removed via one of a drain and an overflow outlet.

19. According to any one of the preceding embodiments, the method further including a step of monitoring a level of the liquid and triggering an alarm when the level of the liquid is higher than a threshold.

20. A chemical mechanical polishing (CMP) chamber includes a chamber body, a door mounted on the chamber body and a chamber substructure being one selected from a group consisting of a moisture separator separating a moisture generated in the CMP chamber, a supplementary exhaust port, a transparent window mounted on the door, a sampling port mounted on the door, a sealing material including a metal frame, an o-ring for sealing the door and a combination thereof.

What is claimed is:

1. A chemical mechanical polishing (CMP) system, comprising:
   a working region comprising a polishing chamber for a III-V CMP process or a Ru CMP process, wherein the III-V CMP process or Ru CMP process generates an airborne toxic byproduct, including a toxic gas and moisture in the polishing chamber;
   an exhaust to remove the airborne toxic byproduct from the polishing chamber;
   an exhaust port coupled between the polishing chamber and the exhaust; and
   a moisture separator comprising:
      a separator body;
      an exhaust inlet to receive the airborne byproduct from a first portion of the exhaust into the separator body;
      a cooling element to condense the moisture into a liquid within the separator body;
      a drain to allow the liquid to flow out of the separator body; and
      an exhaust outlet to discharge the hazardous airborne byproduct from within the separator body to a second portion of the exhaust,
   wherein the polishing chamber is a closed chamber comprising:
      a transparent window with a metal frame and an o-ring seal; and
      a sampling port configured to allow the withdrawal of a gas sample including the toxic gas from the polishing chamber on the transparent window.

2. The CMP system as claimed in claim 1, wherein the airborne byproduct is a mixture including one selected from a group consisting of a manufacturing remainder, a toxic gas, a polishing debris, a slurry, a fine particle, a dust, a solid, the moisture, and a combination thereof.

3. The CMP system as claimed in claim 2, wherein the separator body further comprises a first side and a second side that is orthogonal to the first side, wherein the exhaust inlet is coupled to the first side and the exhaust outlet is coupled to second side, and wherein the cooling element is disposed on a wall of the body.

4. The CMP system as claimed in claim 2, further comprising a platen plenum adjacent to the working region to provide a negative pressure within the polishing chamber.

5. The CMP system as claimed in claim 4, wherein the platen plenum comprises a sealing bracket, a handle and a latch.

6. The CMP system as claimed in claim 5, wherein the platen plenum is mounted on the polishing chamber below the window.

7. The CMP system as claimed in claim 1,
   wherein the separator body has a wall, and
   the cooling element is disposed on the wall.

8. The CMP system as claimed in claim 7, wherein the moisture separator further comprises an exhaust inlet coupled to the separator body to receive gases and byproducts including the moisture from the chamber into the separator body.

9. The CMP system as claimed in claim 8, further comprising an exhaust outlet coupled to the separator body to discharge the gases and byproducts without the moisture from the separator body.

10. The CMP system as claimed in claim 8, wherein the byproduct is a mixture being one selected from a group consisting of a manufacturing remainder, a toxic gas, a polishing debris, a slurry, a fine particle, a dust, a solid, the moisture, a liquid, and a combination thereof.

11. The CMP system as claimed in claim 7, wherein the cooling element is one of a cooling chip and a cooling coil.

12. The CMP system as claimed in claim 7, wherein the moisture separator further comprises a sealing plane attached to the separator body, the sealing plane comprising an opening that provides an overflow element providing an additional outlet for the liquid.

13. The CMP system as claimed in claim 12, wherein the moisture separator further comprises a level sensor monitoring a level of the liquid within the separator body.

14. A chemical mechanical polishing (CMP) system, comprising:
   a chamber body for a III-V CMP process or for a Ru CMP process for semiconductor wafers;
   a door mounted on the chamber body;
   a platen plenum to provide a negative pressure within the chamber body; and
   a supplementary exhaust port that is separate from the platen plenum, the supplementary exhaust port removes toxic gases and byproducts generated in the III-V CMP process or Ru CMP process,
   wherein the platen plenum is configured to be pulled out from the chamber body, and comprises:
      a handle, configured to enable an operator to pull out the platen plenum;
      a latch, configured to fix the platen plenum in position below its corresponding polishing chamber; and
      a sealing bracket, configured to seal the platen plenum.

15. The CMP system as claimed in claim 14, wherein the platen plenum is mounted on the chamber body below the door.

16. The CMP system as claimed in claim 14, further comprising a sampling port on the door configured to allow the withdrawal of a gas sample including a toxic gas generated by the III-V CMP process or the Ru CMP process from the polishing chamber.

17. A chemical mechanical polishing (CMP) system, comprising:
   a plurality of polishing chambers each for a III-V CMP process or a Ru CMP process therein, wherein a toxic CMP byproduct is generated by the III-V CMP process or Ru CMP process, each polishing chamber comprising:
      a chamber body at least partially defined by a door;
      a metal frame, configured around the door for enhancing a strength of the door; and
      an O-ring seal disposed in the metal frame and configured to attach to a wall of the polishing chamber for sealing the door;

a plurality of platen plenums, each disposed below a corresponding one of the polishing chambers to provide a negative pressure within that polishing chamber, wherein each platen plenum is configured to be pulled out from the chamber body, and comprises:

a handle, configured to enable an operator to pull out the platen plenum;

a latch, configured to fix the platen plenum in position below its corresponding polishing chamber; and a sealing bracket, configured to seal the platen plenum;

a sampling port disposed in the door, wherein the sampling port allows withdrawal of a sample of gases including a toxic gas generated by the III-V CMP process or Ru CMP process inside the polishing chamber before opening the door;

a plurality of exhaust ports, each disposed on a wall of a corresponding one of the polishing chambers; and an exhaust, connected to each of the exhaust ports, the exhaust comprising:

a moisture separator, for condensing moisture in the CMP byproduct into liquid for flowing out of the CMP system.

18. The CMP system as claimed in claim 17, wherein the door is a plastic door.

19. The CMP system as claimed in claim 17, wherein the door is a transparent door.

20. The CMP system as claimed in claim 17, wherein the platen plenum is mounted on the chamber body below the door.

* * * * *